United States Patent
Feiweier

(10) Patent No.: US 8,503,752 B2
(45) Date of Patent: Aug. 6, 2013

(54) CORRECTION OF DISTORTIONS IN DIFFUSION-WEIGHTED MAGNETIC RESONANCE IMAGING

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 174 days.

(21) Appl. No.: 12/904,312

(22) Filed: Oct. 14, 2010

(65) Prior Publication Data

US 2011/0085722 A1   Apr. 14, 2011

(30) Foreign Application Priority Data

Oct. 14, 2009   (DE) .......................... 10 2009 049 402

(51) Int. Cl.
*G06K 9/00* (2006.01)
(52) U.S. Cl.
USPC ............................ 382/131; 382/128; 382/130
(58) Field of Classification Search
None
See application file for complete search history.

(56) References Cited

U.S. PATENT DOCUMENTS

| | | | | |
|---|---|---|---|---|
| 2004/0114791 A1* | 6/2004 | Atkinson | ...................... | 382/131 |
| 2007/0223832 A1 | 9/2007 | Matsumoto | | |
| 2008/0285835 A1 | 11/2008 | Holland et al. | | |
| 2009/0115794 A1* | 5/2009 | Fukuta | .......................... | 345/581 |
| 2010/0171498 A1* | 7/2010 | Auslender et al. | ............. | 324/309 |

OTHER PUBLICATIONS

"Correction for Distortion of Echo-Planar Images Used to Calculate the Apparent Diffusion Coefficient," Haselgrove et al., Magnetic Resonance in Medicine, vol. 36 ( 1996) pp. 960-964.
"Eddy Current Correction in Diffusion-Weighted Imaging Using Pairs of Images Acquired With Opposite Diffusion Gradient Polarity," Bodammer et al., Magnetic Resonance in Medicine. vol. 51 (2004) pp. 188-193.
"Retrospective Distortion Correction for 3D MR Diffusion Tensor Microscopy Using Mutual Information and Fourier Deformations," Mistry et al., Magnetic Resonance in Medicine, vol. 56 (2006) pp. 310-316.
"Distortion Correction and Robust Tensor Estimation for MR Diffusion Imaging," Mangin et al., Preprint submitted to Elsevier Science (2002).

* cited by examiner

*Primary Examiner* — Nirav G Patel
(74) *Attorney, Agent, or Firm* — Schiff Hardin LLP

(57) ABSTRACT

In a method and magnetic resonance apparatus for correction of image distortions that occur in acquisition of diffusion-weighted magnetic resonance images of an examination subject, a reference image is acquired without diffusion weighting, a first diffusion-weighted image is acquired for a diffusion direction, a second diffusion-weighted image is acquired for the same diffusion direction, with a different diffusion weighting or a different diffusion gradient polarity than the first diffusion-weighted image. The first diffusion-weighted image is deskewed with a first set of deskewing parameters, and the second diffusion-weighted image is deskewed with a second set of deskewing parameters. The deskewing parameters are correlated and determined by simultaneous minimization of differences between the deskewed first image and the reference image and differentiation between the deskewed second image and the reference image.

29 Claims, 5 Drawing Sheets

51  52

CORRECTION OF DISTORTIONS IN DIFFUSION-WEIGHTED MAGNETIC RESONANCE IMAGING

BACKGROUND OF THE INVENTION

1. Field of the Invention

The present invention concerns a method to correct image distortions that occur in exposures of diffusion-weighted magnetic resonance images of an examination subject, and a magnetic resonance system for implementing such a method.

2. Description of the Prior Art

In clinical routine, diffusion-weighted magnetic resonance (MR) images can deliver important diagnostic information, for example in stroke and tumor diagnostics. In diffusion-weighted imaging (DWI), diffusion gradients are shifted in specific directions, with the diffusion of water molecules attenuating the measured magnetic resonance signal along the applied diffusion gradients. A smaller signal attenuation thus occurs in areas with lower diffusion, causing these areas to be depicted with higher image intensity in an imaging magnetic resonance tomography (MRT) measurement (scan). The strength of the diffusion weighting is correlated with the strength of the applied diffusion gradients. The diffusion weighting can be characterized with what is known as the b-value, which is a function of gradient parameters (for example the gradient strength, duration or the distance between the applied diffusion gradients). The acquisition of the resulting magnetic resonance signals ensues with a readout sequence, for example an echoplanar imaging sequence (EPI).

The signal-to-noise ratio (SNR) and geometric distortions are significantly relevant to the quality of acquired, diffusion-weighted image data. The time sequence of the switched (activated) diffusion gradient pulses can thereby cause dynamic distortions, for example due to eddy current effects. Every activation and deactivation of field gradients can induce such eddy currents, which partially decay with relatively long time constants. Upon readout—i.e. upon measurement of the magnetic resonance signals—corresponding field portions can remain, such that distortions result in the acquired image data. Particularly in diffusion-weighted EPI imaging, distortions due to eddy currents represent a significant challenge since here gradient amplitudes are used in combination with a high sensitivity (for example approximately 10 Hz/pixel in the phase coding direction in EPI imaging).

In diffusion imaging, multiple images are acquired with different diffusion directions and diffusion weightings (characterized by the b-value) and combined with one another in order to calculate parameter maps (Apparent Diffusion Coefficient ADC, Fractional Anisotropy FA), for example. The image distortions caused by the diffusion gradients depend both on the amplitude of the gradients (diffusion weighting) and on their direction (diffusion gradient direction). Given a combination of corresponding individual images, the different distortions for each image lead to incorrect associations of pixel information, and therefore to errors (or at least to a reduced precision) in the calculation of parameters. The distortions can be described as transformations. The problem thus exists to determine the corresponding transformations for compensation of these distortions. The determination is hindered because, among other things, the strength of the distortions and the image contrast changes with the variable diffusion weightings and diffusion directions.

To reduce such distortions, a method described in Haselgrove et al., MRM 26:960, 1996 is known, in which a b=0 image, a an undistorted reference, and an additional image with a low diffusion weighting (for example b=150 s/mm$^2$), are acquired for each direction to be corrected. Based on the assumption that the distortion effects scale linearly with the amplitude of the generated diffusion gradients, the distortion parameters are determined using an extrapolation. The actual diffusion-weighted ages (for example b=1000 s/mm$^2$) are therefore corrected. The determination of the distortion parameters ensues by registering the image data of the adjustment measurement and the image data of the reference measurement. Errors in the registration of the image with low diffusion weighting are intensified via the extrapolation. Distortions are also not strongly expressed in these slightly weighted images, such that a precise determination of the distortion parameters is difficult, and occurring errors are again intensified by the extrapolation. Movement of the imaged subject between the acquisition of the reference and the acquisition of the adjustment measurement can furthermore lead to an incorrect determination of the correction parameters.

Furthermore, from the printed document Bodammer et al., MRM 51:188-193, 2004 a method is known in which two images with identical diffusion direction and diffusion weighting but inverted polarity of the diffusion gradients (i.e. opposite diffusion gradient directions) are respectively acquired. The inverted polarity leads to an invariant diffusion contrast given a simultaneous inversion of the distortions (for example, a compression occurs from an extension). The registration of the images is facilitated by the identical contrast; no extrapolation is necessary as well. However, contrast differences can lead to a lacking robustness of the method due to directed movement, for example flow or polarization. Movements of the imagined subject between the acquisition of the two measurements can moreover lead to an incorrect determination of the correction parameters. For example, the signal-to-noise ratio (SNR) of the reference image acquired with inverted polarity is low due to the diffusion weighting, which disadvantageously affects the robustness and precision of the image registration.

In the methods cited above and known from the prior art, a reasonable correction of the acquired MR images can be implemented only when distortions due to eddy currents occur. If and when either the distorted image or the reference image is subjected to other influencing variables, the model assumptions no longer apply and the determined results are incorrect. Among these influencing variables are the movement of the patient and contrast variations between the images that are compared (for example in the registration of a distorted image with b>0 with a reference image with b=0). Despite preventative measures, however, patient movements and contrast variations often occur, such that only an insufficient and even partially incorrect deskewing of the diffusion-weighted images can be achieved with the conventional methods.

Furthermore, methods are known that—in addition to the geometric distortion parameters—strive to determine the parameters of a rigid body movement in order to compensate a patient movement. The increase of the number of parameters to be determined (3 translation parameters and 3 rotation parameters must additionally be determined) that is connected with this type of method reduces both the robustness and the precision of the method with a simultaneous marked extension of the necessary calculation time. Moreover, the rigid body movement represents a reasonable model for the description of the patient movement only in exceptional cases. Only an insufficient, partially incorrect deskewing of acquired, diffusion-weighted MR images is possible with this method.

There is thus a need to avoid incorrect interpretation of patient movements or contrast differences as distortions due to eddy currents, and the incorrect deskewing of diffusion-weighted MR images that is associated therewith. Furthermore, there is a need to work with a reference image with high SNR and to not have to acquire one or more reference images for every diffusion-weighted measurement.

SUMMARY OF THE INVENTION

It is accordingly an object of the present invention to provide an improved correction of image distortions in the acquisition of diffusion-weighted magnetic resonance images with which at least some of the aforementioned disadvantages are avoided.

According to a first aspect of the present invention, a method is provided for the correction of image distortions that occur in acquisition of diffusion-weighted magnetic resonance images of an examination subject. The method includes the acquisition of a reference image without diffusion weighting, the acquisition of a first diffusion-weighted image for a diffusion direction, and the acquisition of a second diffusion-weighted image for the same diffusion direction. The acquisition of the second diffusion-weighted image takes place at least with a different diffusion weighting or a different diffusion gradient polarity than the acquisition of the first diffusion-weighted image. Furthermore, a determination of distortion parameters ensues for the correction of image distortions in the acquired diffusion-weighted images. The first diffusion-weighted image is deskewed with a first set of deskewing parameters, and the second diffusion-weighted image is deskewed with a second set of deskewing parameters. The first set and the second set of deskewing parameters are correlated. The deskewing parameters are determined by simultaneous minimization of differences between the deskewed first image and the reference image and differences between the deskewed second image and the reference image.

The influence of contrast differences between the diffusion-weighted images and the reference image, and the influence of movements of the examination subject on the determined deskewing parameters, can be minimized by the simultaneous registration of the first and second diffusion-weighted images with the reference image with correlated deskewing parameters. Furthermore, the method can operate with a reference image with high SNR. Since systematic registration errors are avoided due to contrast differences, the first and second diffusion-weighted images can be acquired with nearly arbitrary diffusion weighting. Given the acquisition of images (that can also be designated as MR images) with an MR system, the applied diffusion gradient generally determines the diffusion weighting and the diffusion direction. Distortions in the first and second images acquired for the same diffusion direction are also correlated for different diffusion weightings and polarities of the diffusion gradients so that use of correlated parameters for deskewing is advantageous. Diffusion gradients with different diffusion weightings and the same or opposite polarities can be accordingly applied in the acquisition of the first and second image. The minimization of the differences corresponds to the maximization of similarities between the respective deskewed image and the reference image.

According to one embodiment of the method according to the invention, the deskewing parameters describe a transformation, in particular an affine or polynomial transformation. The deskewing parameters can be the elements of a transformation matrix of the second order or the parameters of a polynomial distortion or transformation function, for example. The transformation can be a translation, a scaling and/or a shearing.

A first diffusion gradient with a specific polarity can be applied in the acquisition of the first diffusion-weighted image, and a second diffusion gradient with polarity inversed relative to this can be applied in the acquisition of the second diffusion-weighted image. The diffusion gradients with inverted polarity can thereby be provided with the same diffusion direction but lead to inverted distortions, in particular if the same diffusion weighting predetermined by the gradient amplitude is used. This particular correlation of the distortions enables a particularly effective and advantageous determination of the deskewing parameters. The first set of deskewing parameters advantageously describes a transformation and the second set of deskewing parameters describes a transformation that is inverse to the aforementioned transformation. With this type of correlation of the deskewing parameters, the one set of deskewing parameters is clearly determined by the other set. The number of parameters to be determined can therefore be reduced, and furthermore the influence of contrast differences and movements of the examination subject is minimized by such a linking.

The simultaneous minimization of the differences can ensue by means of an iterative optimization method, for example. In particular a simplex minimization method or a descending gradient method can be used for this. These methods can likewise be used to maximize the similarity between the images and the reference image, which is equivalent.

According to a further embodiment of the method according to the invention, the simultaneous minimization of the differences comprises the determination of a first measure of similarity between the deskewed first image and the reference image and a second measure of similarity between the deskewed first image and the reference image. These measures of similarity can be maximized simultaneously to minimize the differences. In particular, for this an average measure of similarity can be determined from the first and second measure of similarity, and this average measure of similarity can be maximized. The maximization can ensue via multiplication of the average measure of similarity with −1 and subsequent minimization with one of the aforementioned methods, for example. Efficient optimization methods that are generally configured to minimize a function can thus be used.

The respective measure of similarity can be determined based on the respective complete diffusion-weighted image and the complete reference image. Other advantageous methods to determine the measure of similarity can therefore be used that, for example, cannot be applied in a per-line determination of this. For example, the first and second measure of similarity can be a cross-correlation measure or entropy measure determined via the comparison of the first or second deskewed diffusion-weighted image with the reference image. These can be determined with a corresponding evaluation function. In particular the "Normalized Mutual Information" with which a precise determination of a measure of similarity based on the respective complete image is possible is considered as a measure of entropy.

According to a further embodiment of the invention, a movement of an examination subject can be detected in the acquired images, wherein the deskewing parameters are determined only on the basis of those images for which the movement is less than a predetermined limit value. The movement of the examination subject can be detected, for example, by means of the cross-correlation measure or the entropy measure, wherein only images for which the cross-correlation measure or, respectively, the entropy measure is greater than a predetermined limit value are used for the determination of the deskewing parameters. For example, since movement of the patient leads to a low correlation, the simple detection of movements is thus possible. If a movement beyond the limit value is detected, the corresponding image can be acquired again.

The acquisition of the reference image between the acquisition of the first diffusion-weighted image and the acquisition of the second diffusion-weighted image is particularly advantageous. Since each of the images is compared with the reference image, the influences of movements can be further minimized with this order, due to the correlated deskewing parameters.

A filtering of the reference image and/or the respective diffusion-weighted image can be implemented to determine the respective differences. The robustness of the registration can therefore be significantly improved.

For example, the filtering can be done using a mask that is determined on the basis of the reference image and/or the respective diffusion-weighted image, wherein the determination of the differences takes into account only image regions encompassed by the mask. The filtering can also be done by means of an edge-preserving filter. The dependencies of the image comparison on contrast can be significantly reduced with such a filter, for example a Sobel filter. For example, in the filtering with a mask only image regions with intensities above a defined limit value are taken into account in the image registration. Such a mask can be generated in an adjustment measurement or based on the reference measurement, for example. Through the filtering, the assessment of the differences or similarity of the images can be limited to the information-bearing portions of the respective image. The robustness of the method can therefore be improved and an exact detection of distortions can be enabled.

The correction of image distortions in acquired magnetic resonance images for different predetermined diffusion directions can ensue with the method, wherein the reference image and the first and second diffusion-weighted image can be acquired for each diffusion direction. An optimally precise correction of the distortions for the respective diffusion direction can therefore be provided. It is also possible to acquire the first and second diffusion-weighted image for each diffusion weighting to be acquired if an optimally exact correction is desired.

The acquisition of the reference image and/or the acquisition of the first and second diffusion-weighted image can also ensue within the framework of an adjustment measurement. It is therefore not necessary to acquire the images to determine the deskewing parameters for every single diffusion weighting. For example, the deskewing parameters for a predetermined diffusion weighting can be determined, wherein the deskewing parameters are extrapolated for the correction of magnetic resonance images that were acquired with a different diffusion weighting than the predetermined diffusion weighting. Since the first and second diffusion-weighted image can be acquired with a high diffusion weighting (high b-value), a precise extrapolation of the deskewing parameters is possible in comparison to conventional methods.

In one embodiment, the first diffusion-weighted image and the second diffusion-weighted image are acquired with the same diffusion weighting, wherein the polarity of the diffusion gradients is advantageously inverted. The simultaneous registration (with correlated deskewing parameters) with the reference image can therefore be implemented in a simple manner.

In another embodiment, the first diffusion-weighted image and the second diffusion-weighted image are acquired with different diffusion weightings. The determination of the deskewing parameters can then ensue under consideration of the dependency of image distortions caused by eddy currents on the level of the diffusion weighting. For example, the dependency can then be accounted for via a suitable selection of the correlation between the first and second set of deskewing parameters. For example, the deskewing parameters can be linearly correlated with the diffusion gradient amplitude (which predetermines the diffusion weighting). By the corresponding selection of the correlation relationship it is thus possible to implement a direct registration of the images acquired with arbitrary diffusion weighting and diffusion gradient polarity with the reference image to determine the deskewing parameters.

For example, a corrected, diffusion-weighted image can be determined in that the first or second diffusion-weighted image is deskewed with the first set and the second set of deskewing parameters, or in that the first and second diffusion-weighted image are deskewed with the first and second sets of deskewing parameters and an average deskewed image is determined from these. The signal-to-noise ratio can thereby be improved by using two diffusion-weighted images to determine the corrected MR image.

The method described in the preceding can be implemented automatically by a computer of a magnetic resonance (MR) system.

According to a further aspect of the present invention, a magnetic resonance system is provided to acquire diffusion-weighted magnetic resonance images of an examination subject and to correct distortions in the diffusion-weighted images. The magnetic resonance system has an acquisition unit that is designed to apply a diffusion gradient to generate a diffusion weighting for a diffusion direction and to acquire diffusion-weighted images. Furthermore, a control unit is provided that is designed to control the acquisition unit to acquire a reference image without diffusion weighting; to acquire a first diffusion-weighted image for a specific diffusion direction; and to acquire a second diffusion-weighted image for the same diffusion direction, such that the acquisition of the second diffusion-weighted image ensues at least with a different diffusion weighting or a different diffusion gradient polarity than the acquisition of the first diffusion-weighted image. Moreover, the magnetic resonance system has a computer that is designed to determine deskewing parameters to correct image distortions in the acquired diffusion-weighted images, wherein the first diffusion-weighted image is deskewed with a first set of deskewing parameters, and wherein the second diffusion-weighted image is deskewed with a second set of deskewing parameters; wherein the first and second set of deskewing parameters are correlated; wherein the computer determines the deskewing parameters via simultaneous minimization of differences between the deskewed first image and the reference image and differences between the deskewed second image and the reference image.

Advantages similar to those described in connection with the method also are achieved with the magnetic resonance system according to the invention.

According to an embodiment, the computer is furthermore designed in order to control the acquisition unit to apply a first diffusion gradient with a specific polarity in the acquisition of the first diffusion-weighted image and to apply a second diffusion gradient with polarity inverted relative to said first diffusion gradient in the acquisition of the second diffusion-weighted image.

The invention also encompasses a non-transitory computer-readable storage medium encoded with programming instructions. The programming instructions of the storage medium, when the storage medium is loaded into a computer system of a magnetic resonance apparatus, cause the magnetic resonance apparatus to implement a method as described above, including all embodiments.

DESCRIPTION OF THE PREFERRED EMBODIMENTS

Figure 1:
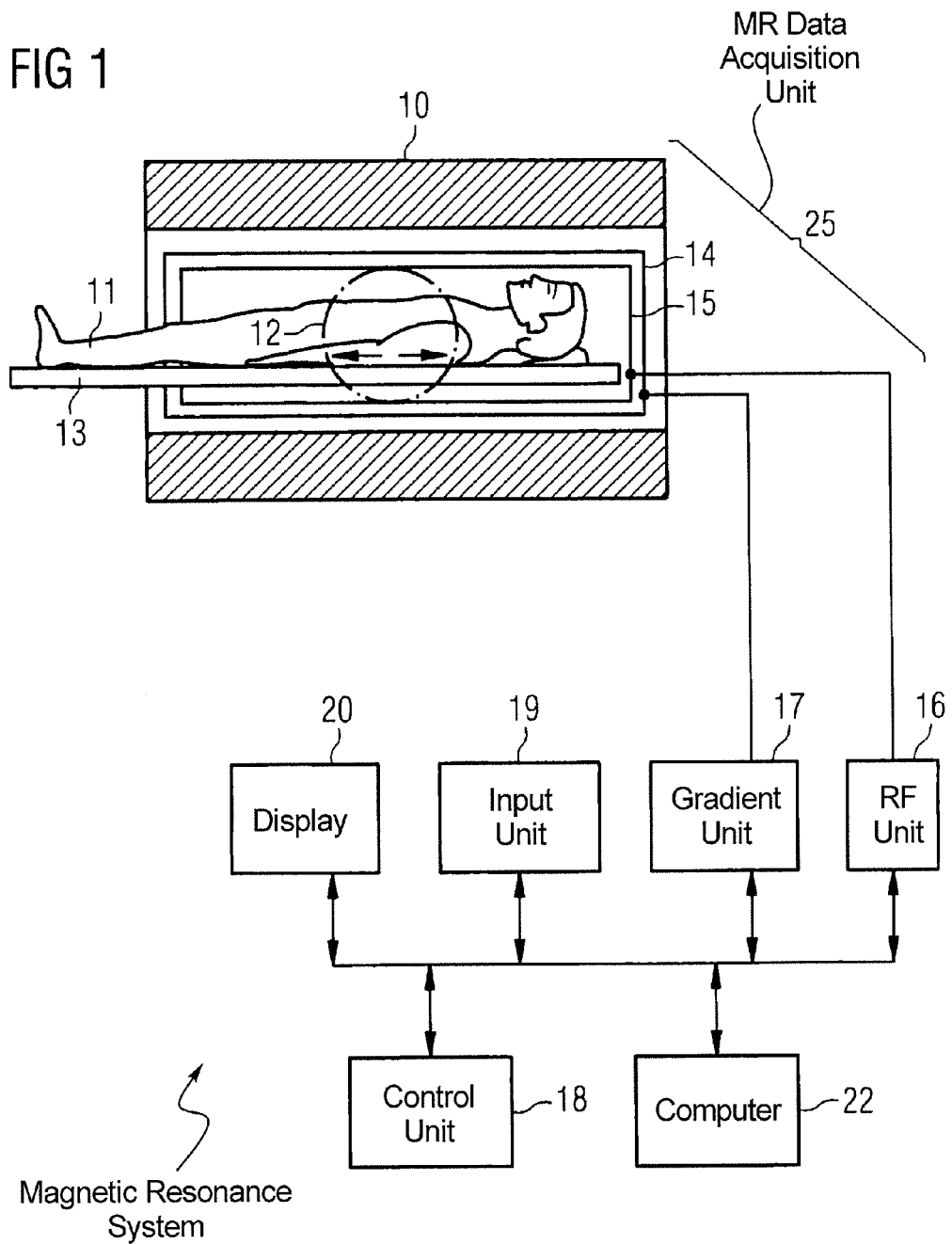
FIG. 1 schematically illustrates an embodiment of the magnetic resonance system according to the invention.

FIG. 1 schematically shows a magnetic resonance system 30 which is configured to implement diffusion-weighted MR measurements, in particular to acquire diffusion-weighted images. Such a magnetic resonance system possesses a magnet 10 to generate a polarization field $B_0$. An examination subject—here an examined person 11—can be slid on a bed table 13 into the magnet 10, as is schematically represented by the arrows. The MR system furthermore has a gradient system 14 to generate magnetic field gradients that are used for imaging and spatial coding. Furthermore, magnetic field gradients for diffusion coding (diffusion gradients) can be generated with the gradient system 15 for diffusion-weighted imaging. The strength and temporal shifting of the diffusion gradients thereby essentially determines the diffusion weighting b, in contrast to which the direction in which the gradients are shifted (diffusion gradient direction g) determines the diffusion direction that is imaged in the image data.

The diffusion imaging is sensitive to a diffusion of water molecules along the diffusion direction predetermined by the shifted diffusion gradients. The greater the amplitude of the shifted diffusion gradients (and therefore the greater the diffusion weighting b), the more pronounced the contrast change in the acquired image relative to an image that is not diffusion-weighted (i.e. b=0). Moreover, the contrast change depends on the diffusion direction since the diffusion coefficient for water molecules in the body of the examined person is strongly directionally dependent due to the structure of the tissue (for example organs, nerve fibers). However, the contrast is generally independent of the polarity of the shifted diffusion gradients, thus whether the gradient is shifted in the +x or −x direction, for example. MR images that were acquired for the same diffusion direction and diffusion weighting but with opposite or, respectively, inverted polarity of the diffusion gradients accordingly exhibit the same image contrast. However, eddy current-induced distortions are likewise inverted due to the inverted polarity in the images.

A radio-frequency coil arrangement 15 that radiates a radio-frequency (RF) field into the examined person 11 in order to deflect the magnetization out of the steady (equilibrium) state is provided to excite the polarization resulting in the primary field of the MR system 30. for example, both excitation pulses (for example 90° sinc pulses) or rephasing pulses (for example 180° pulses) can be radiated by means of the RF coil arrangement 15. A gradient unit 17 is provided to control the magnetic field gradients and an RF unit 15 is provided to control the radiated RF pulses. Magnetic resonance signals can be acquired from the examination region 12 by means of the RE coil arrangement 15 and the RF unit 16. Gradient system 14 and radio-frequency coil arrangement 15 as well as RF unit 16 and gradient unit 17 can together be designated as an acquisition unit 25.

The control unit 18 centrally controls the magnetic resonance system, for example the implementation of a predetermined imaging MR sequence with predeterminable diffusion weighting and diffusion direction. A selection of the imaging sequence to be implemented can ensue with the input unit 19. Control information—for example imaging parameters—and reconstructed MR images can be displayed on the display 20. Parameters for diffusion imaging (for example the b-values and diffusion directions for which the acquisition of images should ensue) can also be selected via the input unit. Furthermore, the magnetic resonance system has a computer 21 that serves for the reconstruction of images from acquired MR signals and the correction of distortions in such reconstructed, diffusion-weighted images (described in more detail in the following).

The magnetic resonance system schematically shown in FIG. 1 can naturally include additional components that magnetic resonance systems conventionally have. The general mode of operation of an MR system is known to those skilled in the art, such that a detailed description of the general components is not needed herein.

To conduct an examination by means of diffusion-weighted MR imaging, computer 21 can determine deskewing parameters to deskew acquired, diffusion-weighted images within the scope of an adjustment measurement. The control unit 18 is configured in order to initially cause the acquisition of MR signals without diffusion weighting from a slice in the examination region 12 within the scope of the adjustment measurement. A corresponding reference image for b=0 can be reconstructed in computer 21 from the acquired MR signals. Furthermore, the control unit 18 controls the acquisition unit 25 to acquire two images with predetermined diffusion weighting and diffusion direction, wherein the polarity of the diffusion gradients created in the acquisition is inverted between the acquisitions. This first and second diffusion-weighted image can in turn be reconstructed in computer 21 from the acquired MR signals.

To determine the deskewing transformation to deskew the diffusion-weighted images, computer 21 is configured to bring the two diffusion-weighted images into registration with the reference image simultaneously, wherein correlated transformation parameters are used in the registration. For this purpose, computer 21 determines a measure of similarity between the diffusion-weighted images deskewed with the transformation parameters and the reference image and maximizes this measure of similarity, for example with a simplex method. From the deskewing or transformation parameters determined in such a manner, the computer 21 subsequently determines deskewing parameters for different diffusion weightings by extrapolation. Such a determination of deskewing parameters can ensue during the adjustment measurement for different diffusion directions for which diffusion-weighted images are subsequently to be acquired.

The control unit 10 and computer 21 can also be configured to respectively acquire the reference mage and the first and second diffusion-weighted image for every diffusion-weighted measurement to be conducted, no a particularly precise correction of distortions in the images is ensured. Mixed approaches—for example the acquisition of the reference images only during an adjustment measurement and the acquisition of the two images with inverted polarity for every diffusion weighting and diffusion direction to be measured, or the like—are naturally also conceivable.

Figure 2:
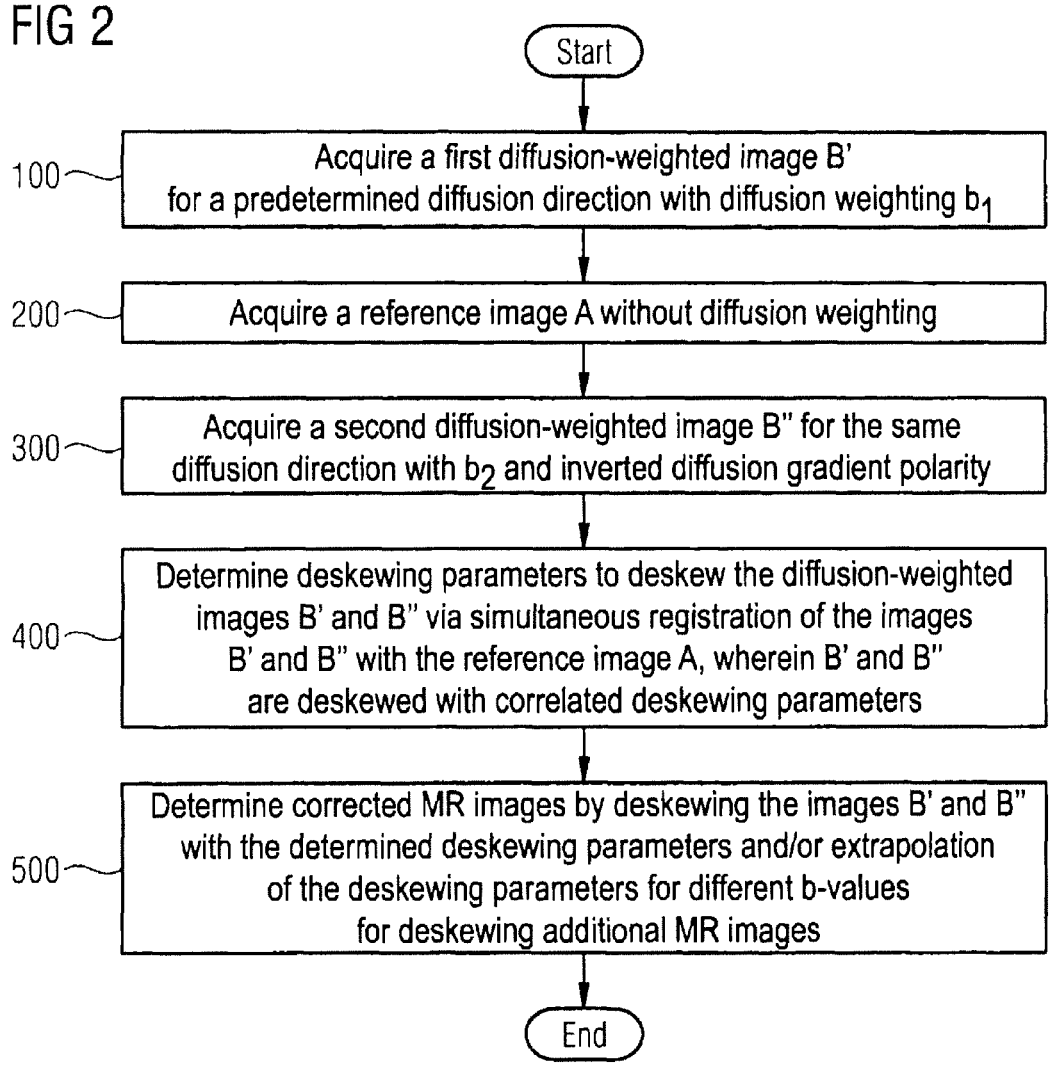
FIG. 2 is a flowchart of an embodiment of the method according to the invention.

FIG. 2 shows a flowchart of an embodiment of the method according to the invention that can be implemented with the magnetic resonance system 30 of FIG. 1. In the method according to the embodiment, distorted, diffusion-weighted images and reference images are acquired in such a manner that it is possible to differentiate between distortions due to eddy currents and other influencing variables. For this purpose, two images B' and B" with inverted diffusion gradients and a reference image A are respectively acquired in temporal proximity. A simultaneous registration of the form B'→A and B"→A subsequently occurs, wherein the images B' and B" are deskewed with correlated deskewing parameters. A reference image with high signal-to-noise ratio (since b=0) can thus be registered and system registration errors due to contrast differences can be avoided. This is achieved with the embodiment according to FIG. 2 in which the reference image A is acquired chronologically between the two distorted, diffusion-weighted images B' and B". Given a determination of the deskewing parameters for different slices and different diffusion directions, the order B'-A-B" can be maintained for every slice and every diffusion direction.

The acquisition of the first diffusion-weighted image B' for a predetermined diffusion direction with a diffusion weighting $b_1$ ensues in the first Step 100 of FIG. 2. The acquisition of an image ensues with the implementation of an imaging MR sequence, for example by the application of a slice-selection gradient and a phase coding gradient, radiation of 90°/180° RF excitation or refocusing pulses, application of diffusion gradients and detection of MR signals with a readout sequence (for example an EPI sequence). The diffusion weighting ensues by the application of the diffusion gradients of the corresponding strength in the predetermined diffusion direction with specific polarity before the detection of the MR signals. In a next Step 200 the acquisition of a registration image A ensues without diffusion weighting, i.e. with b=0. The reference image A accordingly contains no distortions due to eddy currents and exhibits a high signal-to-noise ratio. In Step 300 the second diffusion-weighted image B" is acquired for the same diffusion direction with the diffusion weighting $b_2$ and with inverted diffusion gradient polarity. The same diffusion direction is thus imaged, but the distortions in images B' and B" that are induced by eddy currents are inverted due to the different polarity of the diffusion gradients.

The diffusion weightings $b_1$ and $b_2$ can be the same, such that they images B' and B" exhibit the same contrast. However, it is also possible to acquire the images B' and B" with different diffusion weighting given the same or an inverted diffusion gradient polarity. This merely leads to a change of the correlation between the first net and the second net of deskewing parameters. With knowledge of the change of the b-value it is possible to accordingly adapt the correlation between the deskewing parameters for the images B' and B". For example, the deskewing parameters are correlated linearly with the gradient amplitude. In this case a determination of the deskewing parameters is also possible by direct registration of the images B' and B" with the reference image. In the following a special case is assumed in which the two images are acquired with the same diffusion weighting given inverted polarity of the diffusion gradients. However, it should be clear that the subsequent statements are likewise applicable to the more general case of arbitrary diffusion weighting and gradient polarity, possibly with a corresponding adaptation of the correlation that is used.

The determination of deskewing parameters to deskew the diffusion-weighted images B' and B" ensures by simultaneous registration of images B' and B" with the reference image A (and B' and B" are deskewed with correlated—for example inverted—deskewing parameters) ensues in Step 400. The registration can ensue by means of an iterative minimization method that varies the deskewing parameters and thus minimizes the difference between the respective deskewed image and the reference image. This is subsequently described in more detail with reference to FIG. 3. Through the correlation of the deskewing parameters it is ensured that other distortions—for example a displacement due to the movement of the examined person—is not misinterpreted as a distortion due to eddy currents and that an incorrect deskewing transformation is not accordingly determined. For example, if the examined person moves during the acquisition of the three images B', A and B", the imaged structure is shifted by a certain length in each image, which can be compensated via the simultaneous registration of the images B' and B" with the image A with correlated parameters.

The determination of corrected MR images with deskewing parameters determined by deskewing the images B' and B" ensues in Step 500. Alternatively or additionally, the extrapolation of the deskewing parameters with regard to other diffusion weightings (b-values) for deskewing additional MR images can ensue. This is particularly advantageous in the acquisition of images during an adjustment measurement, wherein subsequent diffusion-weighted images can be corrected without the acquisition of additional reference images by means of the extrapolated deskewing parameters.

Figure 3:
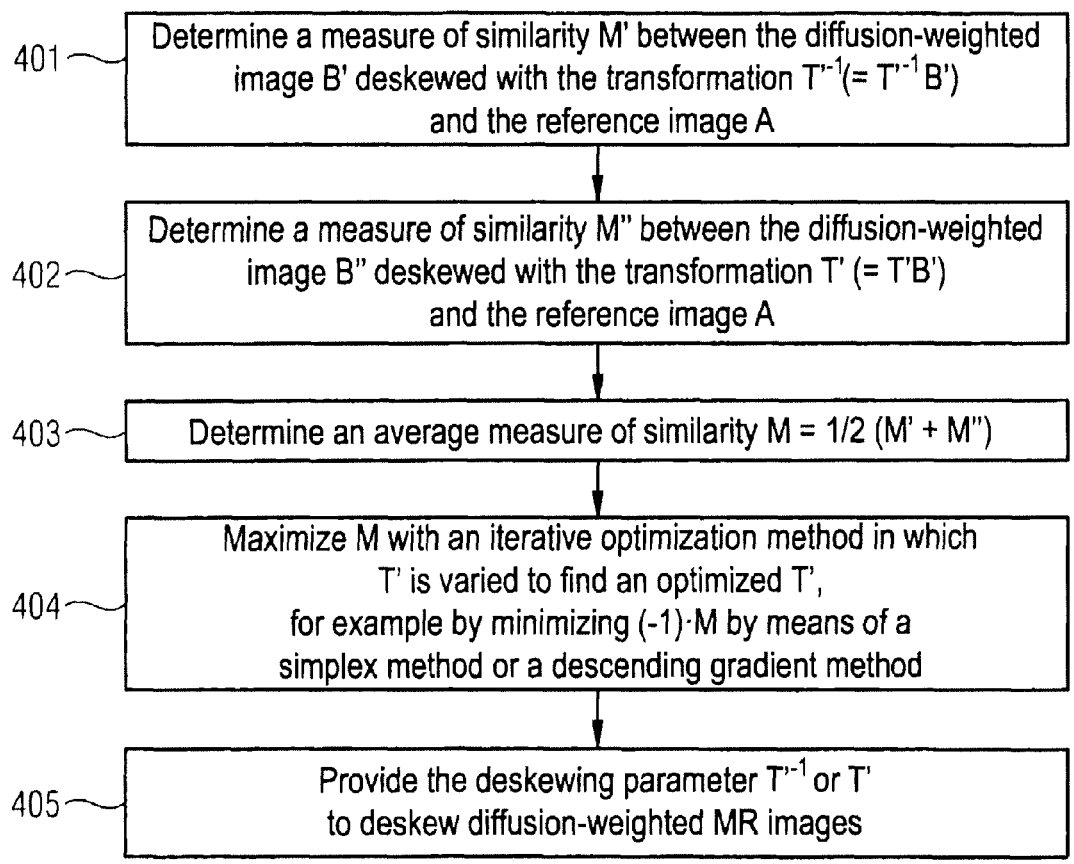
FIG. 3 is a flowchart that illustrates the determination of deskewing parameters according to an embodiment of the method according to the invention, wherein the method can be implemented at Step 400 of FIG. 2.

FIG. 3 is a flowchart of an embodiment of the method according to the invention that illustrates the determination of the deskewing parameters according to Step 400 of FIG. 2 in detail. In the following it should be assumed that the images B' and B" were acquired with identical diffusion weighting given inverted gradient polarity, and thus exhibit an identical contrast. The corresponding undistorted, diffusion-weighted image with identical contrast is designated as B in the following. The distorted image B' is obtained by distorting this image B with the unknown distortion transformation T:

$$B'=TB \quad (1)$$

Due to the inverted diffusion gradients, the distortions in the image B" are likewise inverted, such that the image B" can be represented with the inverse transformation $T^{-1}$ as follows:

$$B'=T^{-1}B \quad (2)$$

Figure 4:
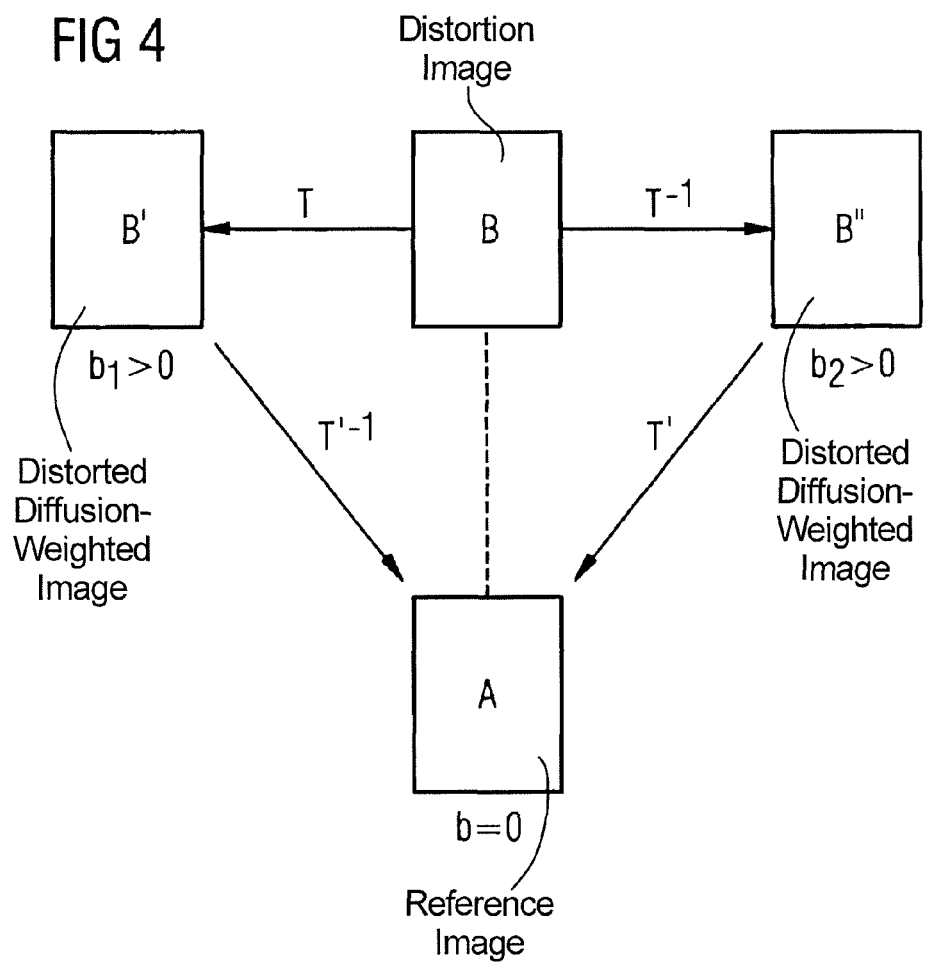
FIG. 4 is a schematic representation of the transformations between diffusion-weighted images and the reference image.

$T \cdot T^{-1}=1$ applies for the distortion transformation T and its inverse $T^{-1}$, wherein 1 designates the unit matrix. The inverse transformation is therefore unambiguously determined by the transformation T. With knowledge of the transformation T the distortion-free image B can thus be determined. This is also illustrated in FIG. 4.

However, since the image B cannot be measured, the determination of the distortion transformation T' takes place between the deskewed diffusion-weighted image $B_e'$ and the distorted diffusion-weighted image B'. The deskewed images $B_e'$ and $B_e''$ can accordingly be represented as:

$$B_e'=T'^{-1} \cdot B' \quad (3)$$

$$B_e''=T' \cdot B'' \quad (4)$$

A measure of similarity between the deskewed images $B_e'$, $B_e''$ and the distortion-free reference image A is maximized to determine the distortion transformation T'. This can ensue by iterative optimization of the transformation T', which is presented in detail in the following. The registration of the deskewed images $T'^{-1} \cdot B'$ and $T'^{-1} \cdot B''$ with the reference image A is illustrated by a rows in FIG. 4. The images A and B are both distortion-free and only exhibit contrast differences due to the diffusion weighting, such that a good deskewing of the diffusion-weighted images can also ensue by means of T' instead of T. The deskewing parameters that describe this transformation T' are determined in the following.

Different transformations can be used to describe the distortion. For example, simple affine transformations that comprise a shearing (S), a scaling (M) and a translation (T) as well as more geometrically complex transformations are conceivable. For example, an affine transformation can be represented by a matrix of the 2nd order. A polynomial transformation that is determined by the parameters of a polynomial distortion function is considered as a more complex transformation, for example. These parameters or the elements of the transformation matrix are determined as deskewing parameters.

The determination of a measure of similarity M' between the image diffusion-weighted B' deskewed with the transformation T' (i.e. the deskewed image $T'^{-1}B'$) and the reference image A ensues initially in Step 401. Furthermore, the determination of a measure of similarity M'' between the image diffusion-weighted B'' deskewed with the inverse transformation T''' (i.e. with the deskewed image T'B'') and the reference image A ensues. The measures of similarity are thus represented as follows:

$$M' = F(T'^{-1}B', A) = F(T'^{-1}TB, A) \quad (5)$$

$$M'' = F(T'B'', A) = F(T'T^{-1}B, A) \quad (6)$$

wherein F designates an evaluation function to determine the similarity.

From the above it is clear that the deskewing is optimal when the determined distortion transformation T' and the actual deskewing transformation $T^{-1}$ are as identical as possible ($T'T^{-1}=1$). The transformation T' is determined in that the measures of similarity M' and M'' are simultaneously maximized. Expressed in another way, the differences between the images B' and B'' that are deskewed with the transformation T' and the reference image A are minimized simultaneously. Various possibilities are provided to calculate the measures of similarity M' and M'' by means of the evaluation function F. For example, a cross-correlation measure as a measure of similarity can be determined by means of a cross-correlation between the respective diffusion-weighted image and the reference image. The determination of a measure of entropy is particularly advantageous, for example the Normalized Mutual Information (NMI). A more precise determination of the similarity of the compared images is possible with this measure, independent of contrast differences. The determination of the measure of similarity can additionally be improved in that the images to be compared are subjected to a suitable pre-processing.

For example, the evaluation of similarity of two images with a noise detection can be limited to the information-bearing portions of the images. For example, one of the adjustment measurements can be used to determine the diffusion-weighted images or the reference measurement to determine the reference image to generate a mask. Only image regions with intensities above a defined limit value (which can be hard-set or dynamically determined from the image information, for example) are then used in the image registration. An edge-preserving filter (for example a Sobel filter) can be used in combination or alternatively. The dependencies of the image comparison on the contrast (for example between b=150 and b=0) can therefore be significantly reduced. The robustness of the method to determine the deskewing parameters can therefore be improved. The comparison of similarity thus can be implemented on the entire image.

In order to produce a simultaneous maximization of the measures of similarity, in Step 403 an average measure of similarity $M=\frac{1}{2}(M'+M'')$ is determined. This average measure of similarity M is subsequently maximized in Step 4 by means of an iterative optimization method. In each evaluation step the measures of similarity M' and M'' are determined with the optimization method, wherein T' is varied between the evaluation steps. Since most iterative optimization methods are configured to find an optimal global minimum, the maximization of the average measure of similarity can ensue via minimization of the variable $(-1) \cdot M$. The use of a simplex minimization method is thereby particularly advantageous since this requires only function values and not gradients (that are difficult to determine in entropy-based measurements). The simplex optimization method is also normally in the position to find a global minimum in an optimization space with local minima. Other optimization methods (for example the descending gradient method) are naturally also usable.

The transformation T' for which the differences between the deskewed images B' and B'' the reference image A are minimal is therefore determined by locating the maximum measure of similarity M. The diffusion-weighted images B' and B'' can now be deskewed respectively with the deskewing matrix $T'^{-1}$ and the deskewing matrix T'. The provision of the deskewing parameters in the form of matrices $T'^{-1}$ and T' to deskew subsequently obtained diffusion-weighted MR images accordingly ensues in Step 405. As is stated more precisely above with reference to Step 500 of FIG. 2, these deskewing parameters can be determined for each diffusion weighting and diffusion direction, or they can be extrapolated from other diffusion weightings.

The mode of operation of the deskewing is illustrated in more detail in the following in additional examples. If the image B experiences only distortions due to eddy currents and the function F(TB,A) actually has its minimum at T=1, a diffusion-weighted measurement—for example of B' or B''—would suffice in order to determine the deskewing transformation. However, in practice it is to be assumed that at least one of these conditions is not satisfied, for example because of movements of the examined person, significant contrast differences between the images B and A, a low signal-to-noise ratio or occurring image artifacts. The effect of such additional influencing variables can generally not be described as a transformation with which B' can be deskewed and with whose inverse B'' can simultaneously be deskewed. The use of an average measure of similarity that is described in the preceding accordingly reduces the effect of such influencing variables on the result of the registration process.

The acquisition of the images given a movement of the examined person is considered as a first example to illustrate the mode of operation of the method according to the present embodiment and the improved deskewing of acquired, diffusion-weighted MR images. The movement of the examined person between the acquisition of the first distorted image B' and the acquisition of the reference image A leads to a displacement of the image that can be described by the transformation V (displacement transformation). Without the use of the method described in the preceding, this displacement is interpreted as a distortion due to eddy currents, which leads to the determination of a correspondingly incorrect transformation T. With the method according to the present embodiment the distorted images B' and B'' can be expressed as a transformation of the undistorted, diffusion-weighted image B as follows:

$$B'=TB \quad (7)$$

$$B''=T^{-1}VB \quad (8)$$

The reference image A in this example is likewise subject to the movement transformation:

$$A'=VA$$

If these expressions are used in the equations to determine the measures of similarity M' and M'', the following expressions result:

$$M'=F(T'^{-1}B',A')=F(T'^{-1}TB,VA) \quad (9)$$

$$M''=F(T'B'',A')=F(T'T^{-1}VB,VA) \quad (10)$$

From these equations it is clear that the influence of the movement on the determination of the deskewing parameters T' is reduced. The average measure of similarity M is maximal when both $T'^{-1}$ and $T'T^{-1}V$ correspond approximately to V. However, since both requirements cannot be satisfied simultaneously, the displacement transformation V at best finds its way only partially into the distortion transformation T' to be determined.

A contrast variation between the diffusion-weighted image and the reference image is considered as an additional example in the following. The contrast differences between a distorted image and the reference image can lead to the situation that, even without the presence of distortions due to eddy currents, the measure of similarity shows an optimum at a transformation K that deviates from a uniform transformation (without distortions caused by eddy currents a uniform transformation would be expected as an optimal result). The contrast differences can thus already lead to an incorrect transformation even without distortions due to eddy currents. Without the use of the method described in the preceding, these deviations would be interpreted as distortions caused by eddy currents and an accordingly incorrect transformation T would be determined. With the method according to the present embodiment, the result of a simultaneous optimization of the measures of similarity M' and M'' would be that M is maximum at T'=K and that M'' is maximum at $T'^{-1}$=K. However, both requirements cannot be satisfied simultaneously, such that—due to the simultaneous maximization of the measures of similarity with correlated transformations or, respectively, deskewing parameters—the deviating transformation K can at best enter partially into the distortion transformation T' that is to be determined. An improved distortion transformation T' in which errors due to the existing contrast differences are reduced can consequently be determined with the method according to the invention.

With reference to FIG. 4 it is noted again that the transformation T' can be designated both as a deskewing transformation and as a distortion transformation due to the correlation of the deskewing parameters. With regard to the image B', T' represents a distortion transformation; the inverse transformation $T'^{-1}$ correspondingly represents a deskewing transformation in order to arrive from the distorted image B' at the deskewed image $B_e'$. With regard to the image B'', the same applies for the inverse transformation, such that here $T'^{-1}$ represents a distortion transformation and T' represents a deskewing transformation. It is also noted again that the use of an inversion merely represents one possible type of correlation between the deskewing parameters for the first and second diffusion-weighted image. If the images are acquired with the same diffusion gradient polarity but with different diffusion weightings, for example, other correlation functions can be used that take into account the linear dependency of the distortions on the gradient amplitude, for example.

Figure 5:
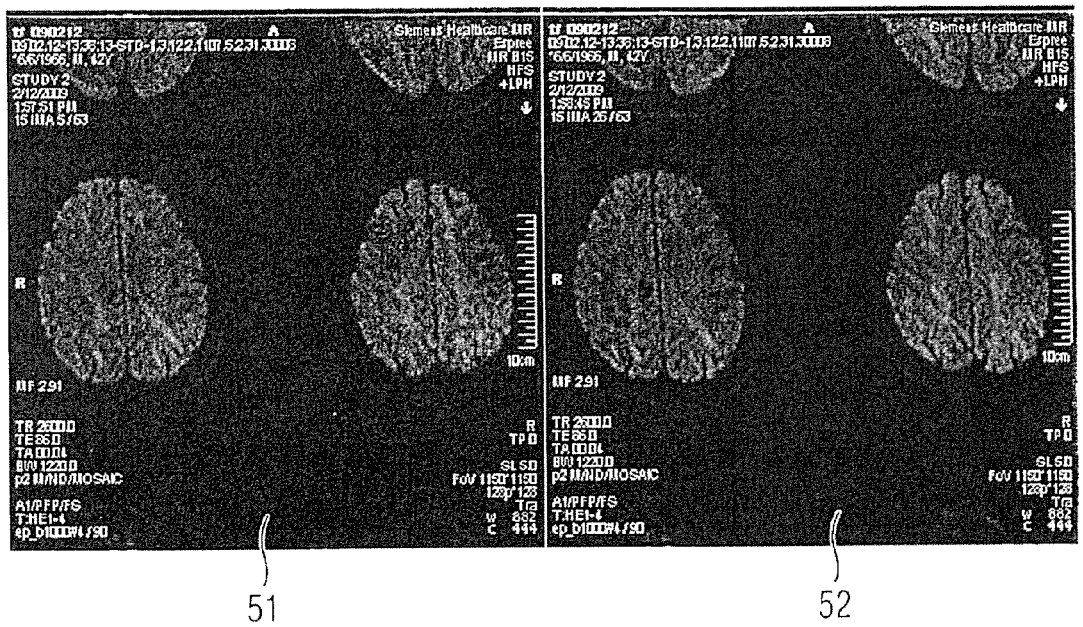
FIG. 5 shows two diffusion-weighted MR images for the same diffusion weighting and diffusion direction that were acquired with inverted polarity of the diffusion gradients.

A first MR image 51 and a second MR image 52 that were acquired for the same diffusion direction and diffusion weighting but for an inverted polarity of the diffusion gradients are shown as examples in FIG. 5. The geometric distortions (identified with arrows) are accordingly inverted in the images. These images can be used together with a corresponding reference image for b=0 to determine the deskewing parameters, for example in the form of the distortion transformation T'

As mentioned above, the reference image and the diffusion-weighted images can be acquired with inverted diffusion gradients for each measurement to be conducted. However, the acquisition can also ensue within the scope of an adjustment measurement, such that the additional measurement complexity to determine the deskewing parameters—and therefore the increase of the measurement time—is slight. In the acquisition of the images patient movements can be detected reliably by means of the measures of similarity (for example the cross-correlation), such that the images can be reacquired given a patient movement beyond a limit value (for example given a cross-correlation measure that is too low). The precision of the determination of the deskewing parameters can be additionally improved via the repetition of the affected measurements.

The features of the embodiments described in the preceding can naturally be combined. The method according to the invention and the magnetic resonance system according to the invention provide a marked improvement of the robustness and precision of the image-based correction of distortions caused by eddy currents in diffusion imaging, in particular in echoplanar (EPI) diffusion imaging. A reduced sensitivity to movements of the examined person is thereby achieved. Furthermore, the determination of deskewing parameters is robust with regard to contrast variations, which enables the use of a reference image with high signal-to-noise ratio.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting image distortions occurring in diffusion-weighted magnetic resonance images obtained from an examination subject, comprising the steps of:
    operating a magnetic resonance data acquisition apparatus to acquire a reference image, without diffusion weighting, from an examination subject;
    operating said magnetic resonance data acquisition apparatus to acquire a first diffusion-weighted image from the examination subject, said first diffusion-weighted image being acquired for a first diffusion direction and with a first diffusion weighting and a first diffusion gradient polarity;
    operating said magnetic resonance data acquisition apparatus to acquire a second diffusion-weighted image from the subject for said first diffusion direction, and with at least one of a diffusion weighting that is different from said first diffusion weighting and a diffusion gradient polarity that is different from said first diffusion gradient polarity; and in a computerized processor, determining a first set of deskewing parameters that deskew said first diffusion-weighted image, and a second set of deskewing parameters that deskews said second diffusion-weighted image and are correlated with said first set of deskewing parameters, by simultaneously minimizing differences between the first diffusion-weighted image, deskewed with first set of deskewing parameters, and the reference image, and differences between the second diffusion-weighted image, deskewed with the second set of deskewing parameters, and the reference image.

2. A method as claimed in claim 1 comprising determining said first and second sets of deskewing parameters as a transformation selected from the group consisting of an affine transformation and a polynomial transformation.

3. A method as claimed in claim 2 comprising selecting said transformation from the group consisting of a translation, a scaling and a shearing.

4. A method as claimed in claim 1 comprising acquiring said second diffusion-weighted image with a diffusion gradient polarity that is inverted with respect to said first diffusion gradient polarity.

5. A method as claimed in claim 4 comprising determining said first set of deskewing parameters as a transformation and determining said second set of deskewing parameters as a transformation that is inverse to the transformation formed by said first set of deskewing parameters.

6. A method as claimed in claim 1 comprising simultaneously minimizing said differences by implementing an iterative optimization procedure.

7. A method as claimed in claim 1 comprising simultaneously minimizing said differences by implementing a minimization procedure selected from the group consisting of a simplex minimization method and a descending gradient method.

8. A method as claimed in claim 1 comprising simultaneously minimizing said differences by determining a first measure of similarity between said first deskewed image and said reference image and determining a second measure of similarity between said deskewed second image and said reference image.

9. A method as claimed in claim 8 comprising simultaneously minimizing said differences by determining an average measure of similarity from said first and second measures of similarity and maximizing said average measure of similarity.

10. A method as claimed in claim 8 comprising determining said first measure of similarity using an entirety of said first diffusion-weighted image and an entirety of said reference image, and determining said second measure of similarity using an entirety of said second diffusion-weighted image and an entirety of said reference image.

11. A method as claimed in claim 8 comprising determining said first measure of similarity as a cross-correlation measure by comparison of said deskewed first diffusion-weighted image with said reference image, and determining said second measure of similarity as a cross correlation measure by comparison of said second deskewed diffusion-weighted image with said reference image.

12. A method as claimed in claim 8 comprising determining said first measure of similarity as an entropy measure by comparison of said deskewed first diffusion-weighted image with said reference image, and determining said second measure of similarity as a cross correlation measure by comparison of said second deskewed diffusion-weighted image with said reference image.

13. A method as claimed in claim 1 comprising detecting movement of the examination subject in each of said first and second diffusion-weighted images, and determining said first and second sets of deskewing parameters only for first and second diffusion-weighted images for which the detected movement is less than a predetermined limit value.

14. A method as claimed in claim 13 comprising detecting said movement of the examination subject as a cross correlation measure between the first diffusion-weighted image and the reference image and a cross correlation measure between said second diffusion-weighted image and said reference image, and using only first and second diffusion-weighted images for which the respective cross correlation measure is greater than a predetermined limit value for determining said first and second sets of deskewing parameters.

15. A method as claimed in claim 14 comprising acquiring said reference image between acquisition of said first diffusion-weighted image and acquisition of said second diffusion-weighted image.

16. A method as claimed in claim 13 comprising detecting said movement of the examination subject as an entropy between the first diffusion-weighted image and the reference image and an entropy measure between said second diffusion-weighted image and said reference image, and using only first and second diffusion-weighted images for which the respective entropy measure is greater than a predetermined limit value for determining said first and second sets of deskewing parameters.

17. A method as claimed in claim 16 comprising acquiring said reference image between acquisition of said first diffusion-weighted image and acquisition of said second diffusion-weighted image.

18. A method as claimed in claim 1 comprising determining said differences by filtering at least one of said first diffusion-weighted image and said reference image, and by filtering at least one of said second diffusion-weighted image and said reference image.

19. A method as claimed in claim 18 comprising implementing said filtering using a mask determined from at least one of said reference image and the respective first or second diffusion-weighted image, and determining said differences using only image regions encompassed by said mask.

20. A method as claimed in claim 18 comprising implementing said filtering using an edge-preserving filter.

21. A method as claimed in claim 1 comprising acquiring a plurality of first diffusion-weighted images respectively for a plurality of additional diffusion directions in addition to said first diffusion direction, acquiring a plurality of second diffusion-weighted images respectively for said plurality of additional diffusion directions, and acquiring a plurality of reference images respectively for said additional diffusion directions.

22. A method as claimed in claim 1 comprising acquiring said reference image, or acquiring said first and second diffusion-weighted images, in an adjustment procedure preceding acquisition of said subsequently-acquired diffusion-weighted images.

23. A method as claimed in claim 1 comprising determining said first and second sets of deskewing parameters for a predetermined diffusion weighting, and extrapolating further first and second sets of deskewing parameters respectively for directing diffusion-weighted images acquired with different diffusion weighting from said predetermined diffusion weighting, by extrapolation of said first and second sets of deskewing parameters for said predetermined diffusion weighting.

24. A method as claimed in claim 1 comprising acquiring said second diffusion-weighted image with a diffusion weighting that is the same as said first diffusion weighting.

25. A method as claimed in claim 1 comprising acquiring said first and second diffusion-weighted images respectively with different diffusion weightings, and determining said first and second sets of deskewing parameters as parameters describing image distortions caused by eddy currents dependent on a level of said diffusion weighting.

26. A method as claimed in claim 1 comprising deskewing said first diffusion-weighted image with said first set of deskewing parameters, and deskewing said second diffusion-weighted image with said second set of deskewing parameters.

27. A method as claimed in claim 25 comprising determining an average deskewed image from the deskewed first diffusion-weighted image and the deskewed second diffusion-weighted image.

28. A magnetic resonance system for correcting image distortions occurring in diffusion-weighted magnetic resonance images obtained from an examination subject, comprising:
- a magnetic resonance data acquisition apparatus that acquires a reference image, without diffusion weighting, from an examination subject;
- said magnetic resonance data acquisition apparatus also acquiring a first diffusion-weighted image from the examination subject, said first diffusion-weighted image being acquired for a first diffusion direction and with a first diffusion weighting and a first diffusion gradient polarity;
- said magnetic resonance data acquisition apparatus also acquiring a second diffusion-weighted image from the subject for said first diffusion direction, and with at least one of a diffusion weighting that is different from said first diffusion weighting and a diffusion gradient polarity that is different from said first diffusion gradient polarity; and
- a computerized processor configured to determine a first set of deskewing parameters that deskew said first diffusion-weighted image, and a second set of deskewing parameters that deskews said second diffusion-weighted image and are correlated with said first set of deskewing parameters, by simultaneously minimizing differences between the first diffusion-weighted image, deskewed with first set of deskewing parameters, and the reference image and differences between the second diffusion-weighted image, deskewed with the second set of deskewing parameters, and the reference image.

29. A non-transitory computer-readable storage medium encoded with programming instructions, said storage medium being loadable into a computer system of a magnetic resonance apparatus and said programming instructions causing said computer system to:
- operate a magnetic resonance data acquisition apparatus to acquire a reference image, without diffusion weighting, from an examination subject;
- operate said magnetic resonance data acquisition apparatus to acquire a first diffusion-weighted image from the examination subject, said first diffusion-weighted image being acquired for a first diffusion direction and with a first diffusion weighting and a first diffusion gradient polarity;
- operate said magnetic resonance data acquisition apparatus to acquire a second diffusion-weighted image from the subject for said first diffusion direction, and with at least one of a diffusion weighting that is different from said first diffusion weighting and a diffusion gradient polarity that is different from said first diffusion gradient polarity; and
- determine a first set of deskewing parameters that deskew said first diffusion-weighted image, and a second set of deskewing parameters that deskews said second diffusion-weighted image and are correlated with said first set of deskewing parameters, by simultaneously minimizing differences between the first diffusion-weighted image, deskewed with first set of deskewing parameters, and the reference image and differences between the second diffusion-weighted image, deskewed with the second set of deskewing parameters, and the reference image.

* * * * *